United States Patent [19]
Ogura et al.

[11] Patent Number: 4,857,987
[45] Date of Patent: Aug. 15, 1989

[54] SEMICONDUCTOR DEVICE

[75] Inventors: Setsuo Ogura, Takasaki; Kazuyuki Kamegaki, Tamamura; Kouichi Yamazaki, Takasaki; Hideo Miyazaki, Takasaki; Yukinori Kitamura, Takasaki; Shirou Mayuzumi, Takasaki, all of Japan

[73] Assignees: Hitachi, Ltd.; Hitachi Microcomputer Engineering Ltd., Tokyo, Japan

[21] Appl. No.: 246,924

[22] Filed: Sep. 19, 1988

Related U.S. Application Data

[63] Continuation of Ser. No. 898,652, Aug. 21, 1986, abandoned.

[30] Foreign Application Priority Data

Sep. 20, 1985 [JP] Japan .................................. 60-206490

[51] Int. Cl.⁴ .......................................... H01L 27/10
[52] U.S. Cl. ...................................... 357/45; 357/92; 357/71

[58] Field of Search ............................... 357/45, 71, 92

[56] References Cited

FOREIGN PATENT DOCUMENTS

2073951 10/1981 United Kingdom .................. 357/71
2106320 4/1983 United Kingdom .................. 357/92

OTHER PUBLICATIONS

IBM Technical Disclosure Bulletin, by Helwig, vol. 22, #8A, pp. 3258-3259, 1980.

Primary Examiner—Andrew J. James
Assistant Examiner—Mark Prenty
Attorney, Agent, or Firm—Antonelli, Terry & Wands

[57] ABSTRACT

Herein disclosed is a semiconductor device including a plurality of IIL elements which are electrically connected by a plurality of first wirings arranged generally parallel with one another and a plurality of second wirings arranged generally parallel with one another and extended in different direction to the first wirings.

25 Claims, 13 Drawing Sheets

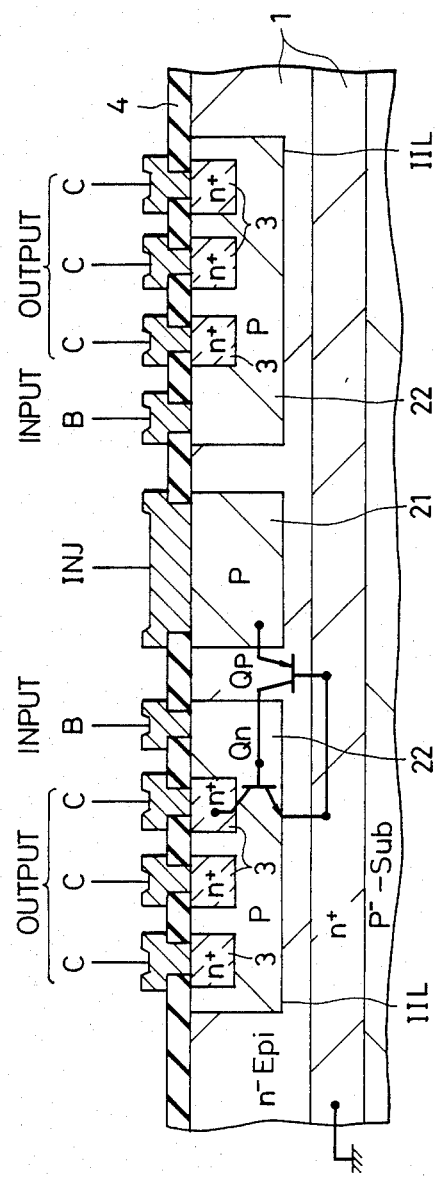

SEMICONDUCTOR DEVICE

This application is a continuation of application Ser. No. 898,652, filed on Aug. 21, 1986 and now abandoned.

BACKGROUND OF THE INVENTION

The present invention relates to a technique which is especially useful when applied to a semiconductor device having a plurality of IIL (i.e., Integrated Injection Logic) elements and, more particularly, to a technique which is effective when applied to a semiconductor integrated circuit device having a logic circuit composed of IIL elements and an analog circuit composed of bipolar transistors.

An IIL element is characterized by a high integration density and a low power consumption. Such an IIL element is produced at a low cost because it can be formed on a substrate by using a similar process to that of fabricating bipolar transistors used in an analog circuit. Therefore, an inexpensive semiconductor device having a logic circuit composed of IIL elements and an analog circuit composed of bipolar transistors has been widely adopted in an IC (i.e., integrated circuit) for public and industrial applications.

The operation speed of the IIL element has been remarkably improved to have a high speed by the recent progress of techniques related to VLSI (i.e., Very Large-Scale Integration) processes and devices. Therefore, the IIL element has been noted as a fundamental circuit for future VLSI.

On the other hand, a wiring method of electrically wiring between semiconductor elements has also been noted in accordance with the recent minute structure of semiconductor elements. This is because the minute structure never fails to promote a higher wiring density.

This high wiring density can be achieved to some extent by adopting a multi-layered wiring structure. Despite of this fact, however, the adoption has to be determined while sufficiently considering how to use the multi-layered wiring layer. If wirings are formed by randomly using the multi-layered wiring layers without determining the usage, the wiring density may sometimes be decreased. This is because the wirings have to be spaced so that they may be prevented from being shorted. Moreover, the drop in the wiring density raises another problem that the integration density of the device itself is also dropped. In the fabrication of the IC composed of highly densified semiconductor elements, therefore, the method of using the multi-layered wirings is considered to become an important target in future.

In the recent design of ICs, on the other hand, the computer-aided design (i.e., CAD) technique for designing the wires between semiconductor elements by using a computer advances to promote shortening of the IC design time.

SUMMARY OF THE INVENTION

An object of the present invention is to provide an IIL element wiring technique which is suitable for automation of a wiring design without blocking high densification of the IIL elements.

The aforementioned and other objects and novel features of the present invention will become apparent from the following description given with reference to the accompanying drawings.

The representative of the invention to be disclosed hereinafter will be briefly described in the following.

Specifically, the wirings for connecting a plurality of IIL elements together are composed of: a plurality of first wirings formed in substantially parallel with one another; and a plurality of second wirings which formed in generally parallel one another; the second wirings extending in a direction substantially perpendicular to the extending direction of the first wirings.

The extending direction of the first wirings which formed in generally parallel one another is determined in relation to the construction of the IIL elements and is the same direction as the extending direction of an injector which is provided correspondingly to the plural IIL elements. And, these first wirings are used as wirings between the plural IIL elements formed in a one-side area of the injector and as wirings provided for reducing the resistance of the injector.

On the other hand, the second wirings are used as wirings between the plural IIL elements formed in the one-side area of the injector and the plural IIL elements formed on the other-side area of the injector.

It is advantageous that the interval of the first wirings is made equal to that of the base and collector electrode terminals of each IIL element whereas the interval of the second wirings is made equal to that of the electrode terminals of the IIL elements.

For the device construction, a multi-layered wiring structure is adopted to form the first and second wiring. The first wirings are formed of a first layer of wiring, and the second wiring are formed of a second layer of wiring. This structure is advantageous when considered from the standpoint that the wirings for reducing the resistance of the injector can be connected all over to the injector.

The more specific wiring structure for improving the wiring density has the following characteristics.

The connecting portions between the first and second wirings may preferably be formed on the base or collector electrode terminals of the IIL elements, i.e., on the so-called "element regions".

Moreover, the wiring width of the first and second wirings in the connecting portions may preferably be equal to the wiring width of the first and second wirings in portions other than the connecting portions.

BRIEF DESCRIPTION OF THE DRAWINGS

FIGS. 6(a), 6(b) and 6(c) are a sectional view, a top plan layout and a circuit diagram showing the IIL, respectively.

DESCRIPTION OF THE PREFERRED EMBODIMENT

Prior to the description of the embodiment of the present invention, the characteristics of the construction of an IIL element will first be described, and the embodiment of the present invention will then be described in detail.

(a) Characteristics of IIL

Figure 6B:
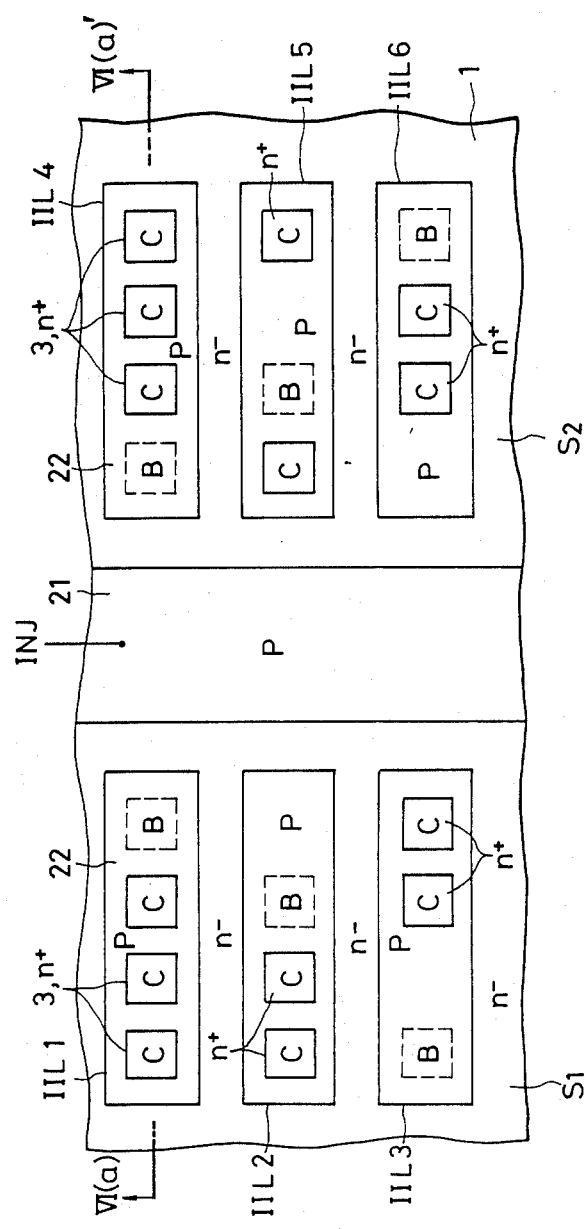
Figure 6C:
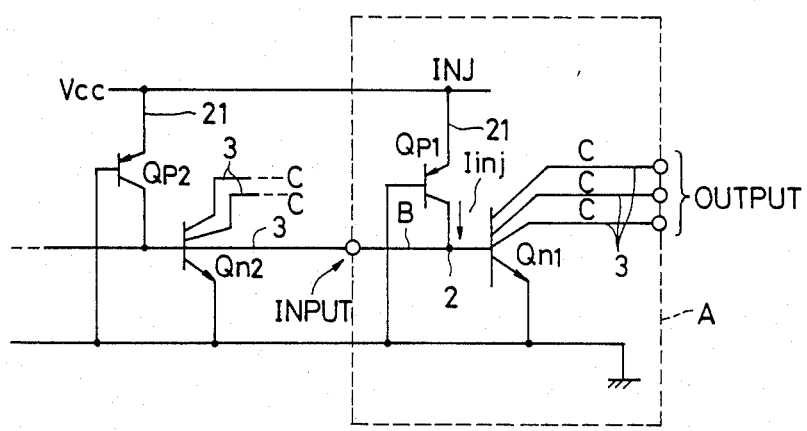

FIGS. 6(a), 6(b) and 6(c) show the construction of an IIL (i.e., Integrated Injection Logic): FIG. 6(a) is a section showing the device; FIG. 6(b) is a top plan layout; and FIG. 6(c) is a basic circuit diagram.

As shown in FIG. 6(c), a basic circuit A of the IIL is composed of a PNP bipolar transistor $Q_{p1}$ acting as a current source and an NPN bipolar transistor $Q_{n1}$ acting as a logic (or IIL) gate. The PNP transistor $Q_{p1}$ has its base connected commonly with the emitter of the NPN transistor $Q_{n1}$ and the collector of the PNP transistor $Q_{p1}$ is connected commonly with the base of the NPN transistor $Q_{n1}$. The NPN transistor $Q_{n1}$ has its base (B) acting as an input and its collector (C) acting as an output. The operations of the IIL thus constructed will be described in the following. When this input is at a high level, an injector current $I_{inj}$ generated by the PNP transistor $Q_{p1}$ is fed to the base (B) of the NPN transistor $Q_{n1}$ so that the NPN transistor $Q_{n1}$ becomes conductive and has its collector potential at a low level. When the input is at the low level, on the other hand, the injector current $I_{inj}$ provides the collector current of an NPN transistor $Q_{n2}$ at an upstream stage so that it is not fed to the base of the NPN transistor $Q_{n1}$. As a result, this NPN transistor $Q_{n1}$ is left nonconductive to have its collector potential at the high level.

A general device structure of the IIL element is made, as shown in FIG. 6(a), by forming a p-type elongated injector diffusion layer (region) 21 and a p-type base diffusion layer (region) 22 in an $n^-$-type epitaxial layer, which is formed in a p-type semiconductor substrate, and one or more of $n^+$-type collector diffusion layers in the p-type base diffusion layer 22. Equivalently, the base region (i.e., the $n^-$-type epitaxial layer) of a PNP transistor $Q_p$ as the injector transistor, the emitter region (i.e., the $n^-$-type epitaxial layer) of an inverse NPN transistor $Q_n$, the collector region of the PNP transistor $Q_p$, and the base region of the inverse NPN transistor $Q_n$ are formed in the common semiconductor region so that the integration density of the IIL can be increased.

FIG. 6(b) shows a layout pattern of a plurality of IIL elements. As seen from FIG. 6(b), a plurality of IIL gates (IIL1 to IIL6) are formed in areas $S_1$ as a first surface area and $S_2$ as a second surface area on both sides of an injector INJ21 as an elongated injector (semiconductor) region. This injector INJ is provided for the plural IIL gates (IIL to IIL6) and is linearly formed for highly integrating the IIL gates. Incidentally, the wiring between the IILs are omitted from FIG. 6(b) so as to simplify the illustration but are shown for the impurity-introduced layers 21, 22 and 3. A plurality of spaced semiconductor regions 22 face to but spaced from one elongated side $S_1$ and $S_2$ of the elongated region 21. As to bases indicated by broken lines, on the other hand, there are shown portions where the bases and the aluminum as wirings are connected. Moreover, the device section taken along line VI(a)—VI(a)' corresponds to FIG. 6(a).

(b) Embodiment

A representative embodiment of the present invention will be described in the following with reference to the accompanying drawings.

Incidentally, the common reference characters appearing in the drawings to be used in the following description are assumed to designate the same or corresponding portions.

Figure 1:
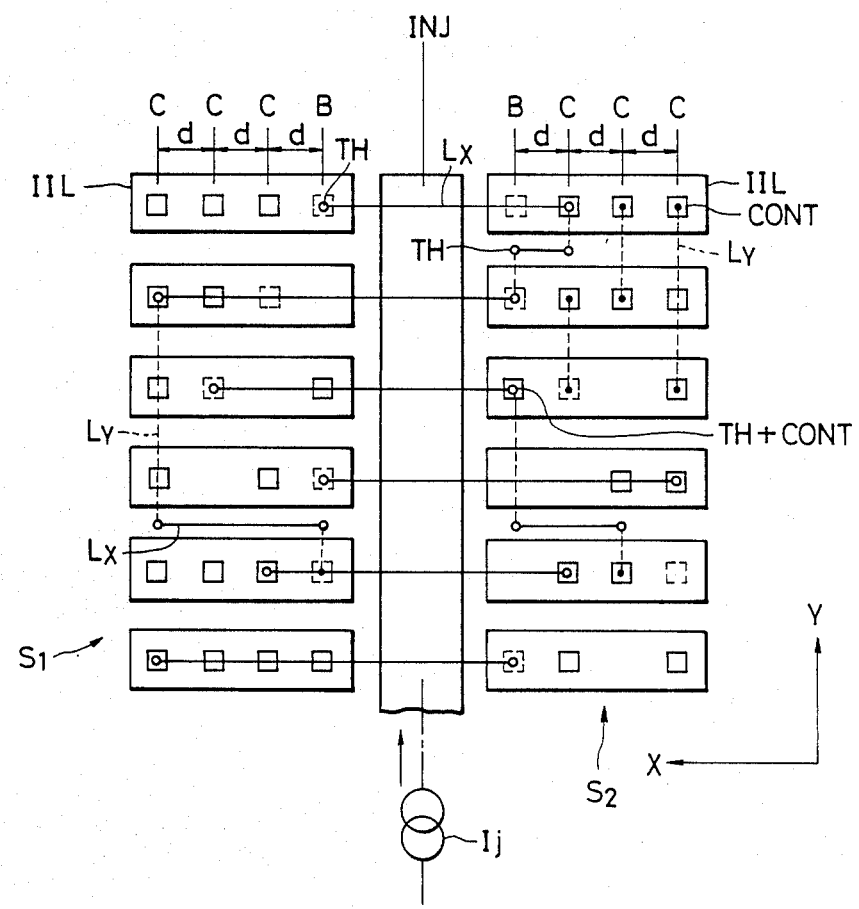
FIG. 1 is a schematic top plan view for explaining a concept of the present invention and shows a state in which first wiring $L_Y$ and second wiring $L_X$ are orthogonally arranged.

FIG. 1 is an enlarged schematic top plan view showing an essential portion of a semiconductor device to which the present invention is applied.

FIG. 1 is an enlarged view showing the IIL element forming portion of a semiconductor device in which an IIL element is formed. It is characteristic that the wirings between the IIL elements are composed of a plurality of first wirings $L_Y$ as first conductive or first elongated conductive members, which are arranged in an identical direction, and which formed in generally parallel one another, i.e., in a Y direction; and a plurality of second wirings $L_X$ which formed in generally parallel one another, and which are arranged in a direction substantially perpendicular (or orthogonal) to those first wirings $L_Y$, i.e., in an X direction. In FIG. 1, the first wirings $L_Y$ are indicated by broken lines whereas the second wirings $L_X$ as first conductive layers or first elongated conductive members are indicated by solid lines.

As seen from FIG. 1, the first wirings $L_Y$ and the second wirings $L_X$ are regularly used to effect the electric connections of the plural IIL elements. This facilitates the software of the automatic wiring design (i.e., the computer-aided design, as will be abbreviated into "CAD") using a computer. This results in shortening the design time of a semiconductor device.

The aforementioned first and second wirings $L_Y$ and $L_X$ are formed by using a multilayer wiring structure. Specifically, the first wirings $L_Y$ are made of a first layer wiring whereas the second wirings $L_X$ are made of a second layer wiring. Namely the first and second wirings are formed at different level. The first and second wirings $L_Y$ and $L_X$ can be electrically connected by forming through holes TH in a first inter-layer insulating film as insulative material which is formed on $SiO_2$ or the like between the first and second layer wiring. Blank circles appearing in FIG. 1 designate the through holes TH. On the other hand, the sold circles designate the contact portions between the first wirings and the base (or collector) regions of IIL gates. Incidentally, for simplicity of illustration, only the blank circles are located at the portions, in which the first wirings $L_Y$ and the second wirings $L_X$ are connected on the base or collector regions of the IIL gates but in which the first wirings $L_Y$ and the base or collector regions of the IIL gates contact as a matter of fact. Moreover, those ones of the second wirings $L_X$, which terminate on the base or collector regions, are underlaid by the portions of the first wirings $L_Y$ contacting with the base or collector regions. Still moreover, the respective wirings $L_Y$ and $L_X$ are made of aluminum.

The characteristics of the method of using the first wirings $L_Y$ and second wirings $L_X$ described above will be described in more detail in the following with reference to FIGS. 2(a) and 2(b).

Figure 2A:
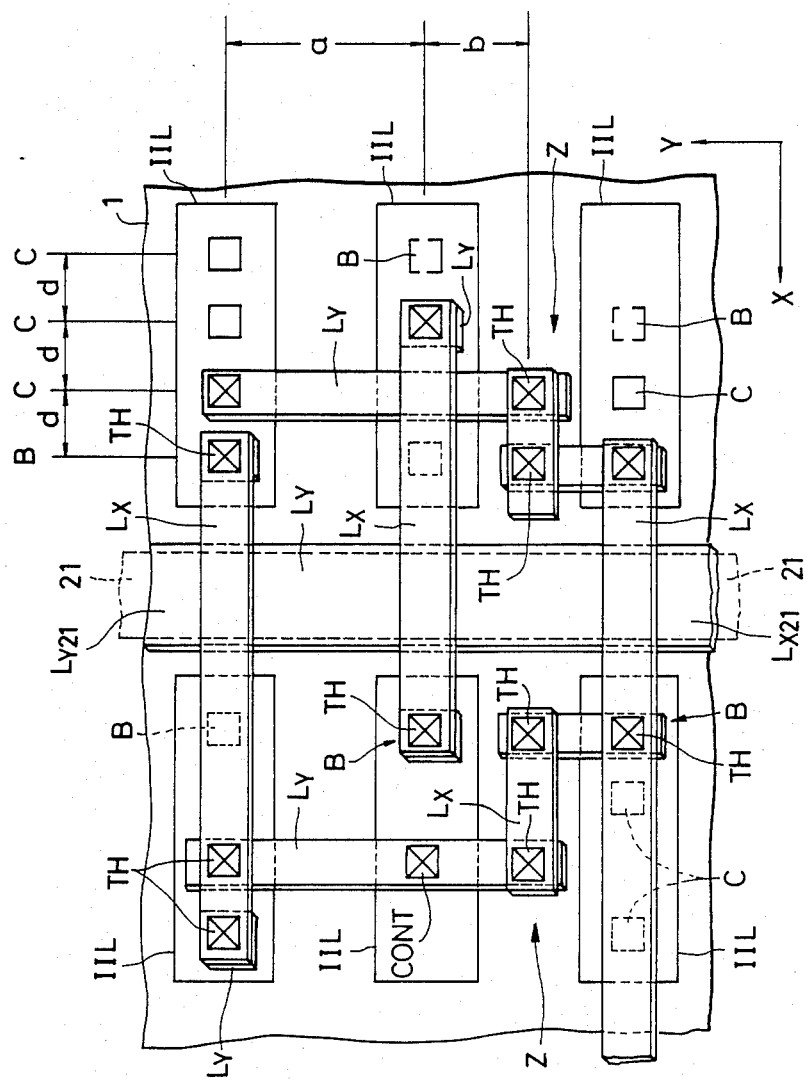
FIG. 2(a) is an enlarged top plan view showing a wiring structure of the present invention shown in FIG. 1 and shows a state in which the array pitch a of an IIL gate is larger than the minimum pitch b of the second wirings $L_X$.
Figure 2B:
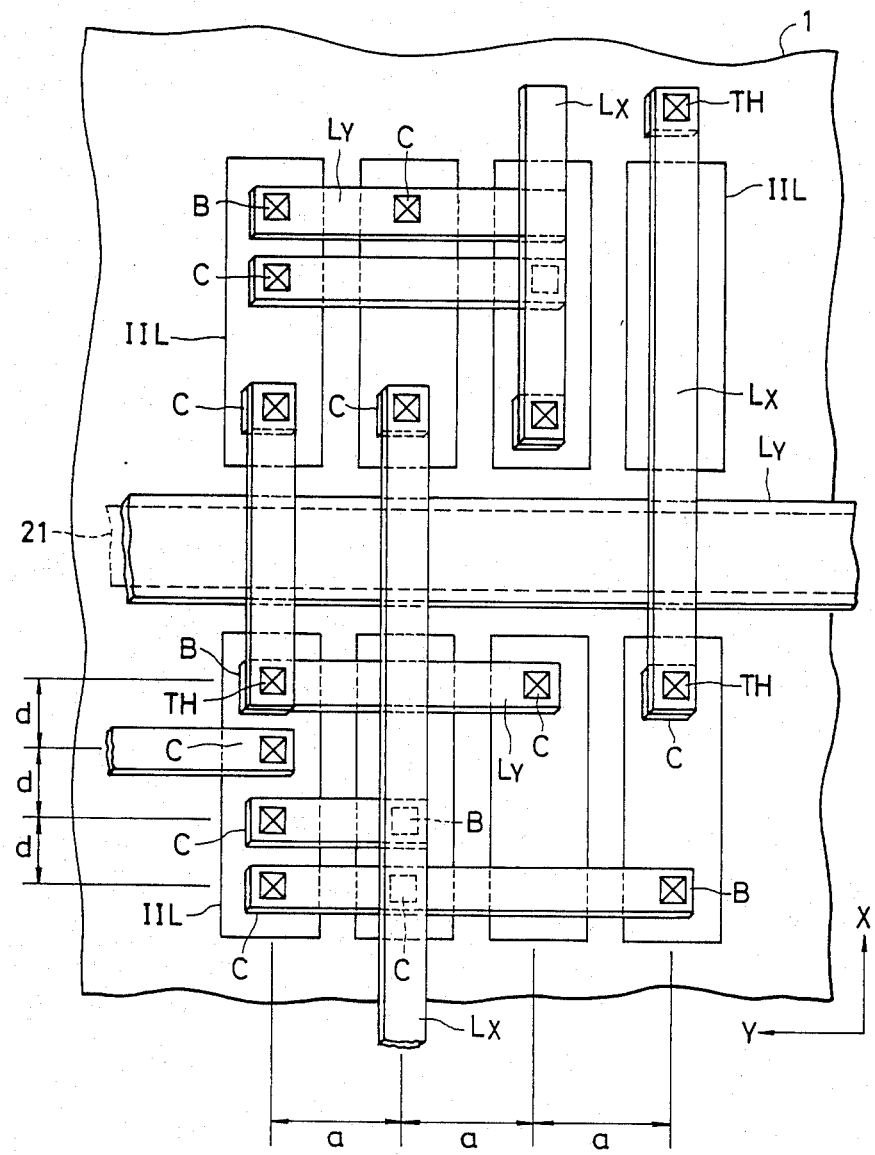
FIG. 2(b) is a top plan view for explaining devised points, in case the present invention is to be applied, and shows a state in which the respective pitches a and b of the first wirings $L_Y$ and the second wirings $L_X$ are regulated.

FIGS. 2(a) and 2(b) shows the first wirings $L_Y$ and the second wirings $L_X$ in an enlarged scale.

As shown in the figure, the first wirings $L_Y$ are formed in the first layer of the multilayer wiring whereas the second wirings $L_X$ are formed in the second layer of the same. Moreover, the first wirings $L_Y$ and the second wirings $L_X$ are suitably connected through the through holes TH so that the wirings of plural IIL gates are regularly effected. Incidentally, the through holes TH are designated by symbols "X", and the contacts CONT are designated by symbols "/".

The first wirings $L_Y$ are arranged in the same direction as the running direction (Y) of the injectors INJ21 of the aforementioned IIL elements. On the other hand, the second wirings $L_X$ are arranged in the direction (X) perpendicular to the running direction (Y) of the injectors INJ21. As a result, the electrodes of the injectors INJ can be formed by the first wirings $L_Y$ so that they can be kept in contact with the whole or the part surface of the p-type injector diffusion layer 21. This leads to an advantage of reducing the diffusion resistance of the doped injector diffusion layer 21 to uniform the operating speeds of the plural IIL gates.

By the second wirings $L_X$, the plural IIL gates, which are formed in the areas $S_1$ and $S_2$ on both sides of an injector electrode $L_{Y21}$, are connected with each other across the injector electrode $L_{Y21}$. Namely, the wiring $L_X$ extend transversely to the elongated region 21 or the electrode 21.

More specifically, the first wirings $L_Y$ are used to connect the plural IIL gates which are formed in the areas $S_1$ (or $S_2$) on one side of the injector electrode $L_{Y21}$. On the other hand, the second wirings $L_X$ are mainly used to electrically connect the IIL gate formed in the areas $S_1$ and the IIL gate formed in the areas $S_2$ across the injector electrode $L_Y21$ connected with the whole or part surface of the injector diffusion layer 21 so as to reduce the resistance of the same layer 21.

FIG. 2(a) shows the case in which the gate array pitch a of the IIL gates is larger than the minimum array pitch b of the second wirings $L_X$. Between the IIL gates, the wirings $L_Y$ and $L_X$ are electrically connected to make effective use of a region Z between the IIL gates thereby to improve the wiring density.

On the other hand, FIG. 2(b) shows the state in which the present invention is applied to other IIL gates. The difference from FIG. 2(a) are: in that the gate array pitch a of the plural IIL gates is equal to the minimum array pitch of the second wiring layers $L_X$; the electrode pitch d between the base B of the IIL gates and the collectors C is equal to the minimum array pitch of the first wirings $L_Y$; and in that the wirings $L_Y$ and $L_X$ are connected on the gate electrodes such as the bases or collectors of the IIL gates. Thanks to those differences in the construction, it is possible to make the array pitch d of the gate electrodes and the array pitch of the wirings $L_Y$ equal to each other and the gate array pitch a and the array pitch of the wirings $L_X$. As a result, the automatic wiring design by the CAD can be better simplified.

Figure 3A:
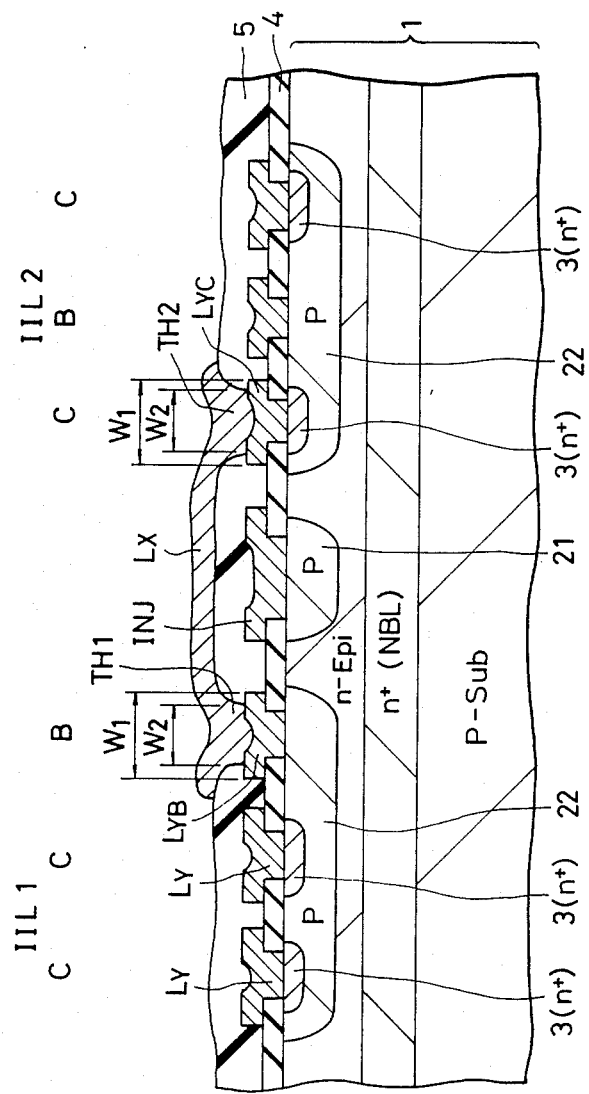
FIG. 3(a) is a sectional view of the device related to the ILL element portion, to which the present invention is applied, and shows the characteristics of the contact portions between the first wirings $L_Y$ and the second wirings $L_X$.
Figure 3B:
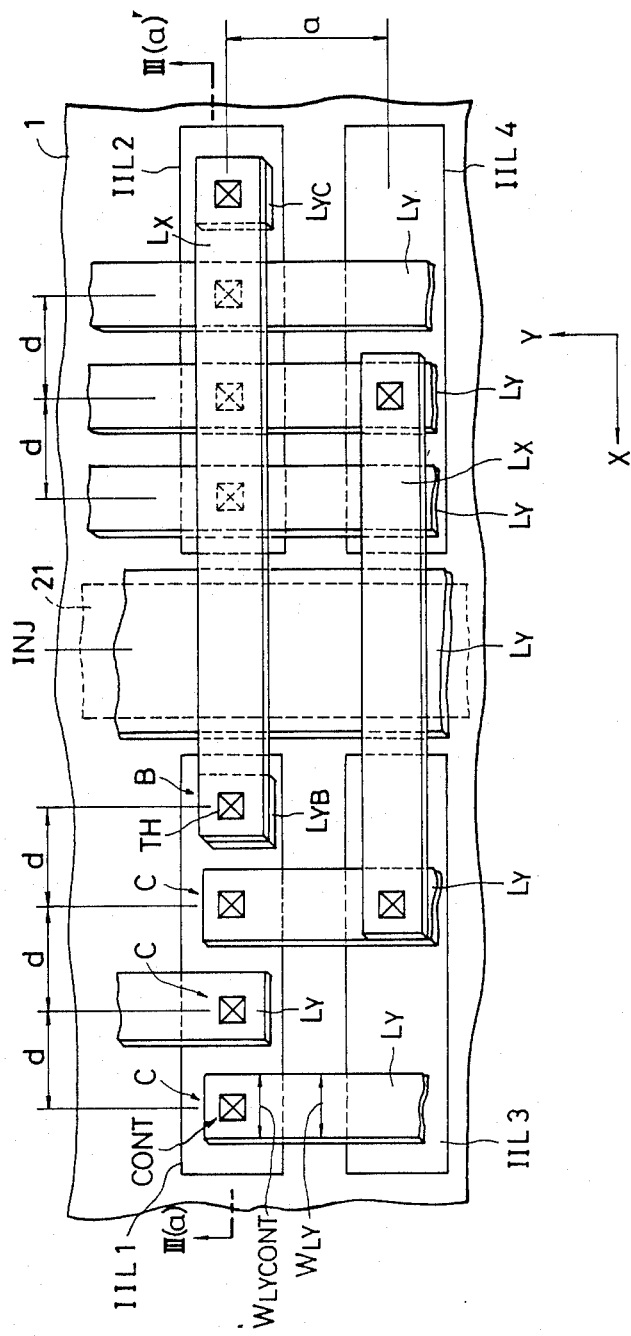
FIG. 3(b) is a top plan layout showing the device and provides the section view.

FIGS. 3(a) and 3(b) are diagrams for explaining the structural characteristics of the aforementioned first wirings $L_Y$, second wirings $L_X$ and through holes TH for making the wiring structure shown in FIG. 2(b). FIG. 3(b) is a device layout, and FIG. 3(a) is a device section view.

FIG. 3(a) shows a section showing a state in which the base B of the IIL gate (i.e., IIL1) and the collector C of the IIL gate (i.e., IIL2) are connected through the second wirings $L_X$. The wirings $L_X$ are connected with the wirings $L_Y$ acting as the gate electrodes of the IIL gates (i.e., IIL1 and IIL2) through the through holes TH1 add TH2 which are formed in a first interlayer insulating film 5. It should be noted that the width $W_1$ of a gate electrode $L_{YB}$ (or $L_{YC}$) is made slightly larger than the width $W_2$ of the through hole TH1 (or TH2), as shown in FIG. 3(a). In an alternative, although not shown, the width $W_1$ of the gate electrode $L_{YB}$ (or $L_{YC}$) and the width $W_2$ of the through hole TH1 (or TH2) are made to have substantially equal values. In other words, the area of the gate electrode $L_{YB}$ (or $L_{YC}$) exposed through the through hole TH1 (or TH2) is made substantially equal to or slightly smaller than the area of the gate electrode $L_{YB}$ (or $L_{YC}$) viewed from above.

As shown in FIG. 3(b), the width $W_{LYCONT}$ of the contacting portion CONT of the wiring $L_Y$ with the collector 3 (or the base 22) is made equal to the width $W_{LC}$ of the wiring $L_Y$ in portions other than the aforementioned contacting portion CONT. Therefore, the wiring $L_Y$ is devised not to bulge at the contacting portion CONT. Likewise, the width $W_{LXTH}$ of the wiring $L_X$ at the through hole TH is made equal to the width $W_{LX}$ of the wiring $L_X$ in portions other than the through hole TH. By these devices, the improvement in the wiring density is achieved.

The cautions of the array of the IIL gates shown is FIGS. 2(b) and 3(b) will be described in the following. In FIGS. 2(b) and 3(b), both the pitch of the wirings $L_Y$ and the pitch of the gate electrodes in the IIL gates are made to have the common value d, and the array pitch of the wirings $L_X$ and the array pitch of the IIL gates are made to have the common value a. In this case, it is the value of the gate electrode pitch d that should be noted. This gate electrode array pitch d is so designed that the inverse current amplification factor $\beta_i$ of the npn inverse transistor $Q_{n1}$ (or $Q_{n2}$) shown in FIG. 6(c) may be sufficiently retained. It has been confirmed by our experiments that inverse current amplification factor $\beta_i$ is proportional to the area ratio $S_C$ and $S_B$ of the area $S_C$ of the collector diffusion layer 3 of the IIL gate viewed from above to the area $S_B$ of the base diffusion layer 22 of the same viewed from above. It is therefore necessary that the array pitch d of the wirings $L_Y$ be determined from the value of the area ratio $S_C/S_B$, i.e., the minimum inverse current amplification factor $\beta_i$ required by the IIL. In the fabrication process the development of which was handles by us, the area ratio $(S_C/S_B)$ has a value of $S_C/S_B \approx 0.078$, and the inverse current amplification factor $\beta_i$ of $\beta_i \approx 4$. It is, however, thought that the relation between the value of the area ratio $S_C/S_b$ and the inverse current amplification factor $\beta_i$ is determined by the fabrication process, and that the inverse current amplification factor $\beta_i$ is to be improved by promising development in the fabrication process.

By making the formations of the wirings $L_Y$ and $L_X$ regular, as described above, the wirings for connecting the IIL gates can be suited for automations by the CAS (i.e., Computer-Aided Design) system. Thus, the wiring design can be optimized for sufficiently automating the wiring design and making the best use of the advantages of the IIL.

Incidentally, in FIG. 3(a), reference numeral 4 designates a surface insulating oxide film, and numeral 5 a first inter-layer insulating film made of a silicon oxide film or a polyimide resin (e.g., polyimideisoindroquinazolinedion).

Next, the wiring direction of third wirings $L_Z$ will be described with reference to FIGS. 3(c), 3(d) and 3(e).

Figure 3C:
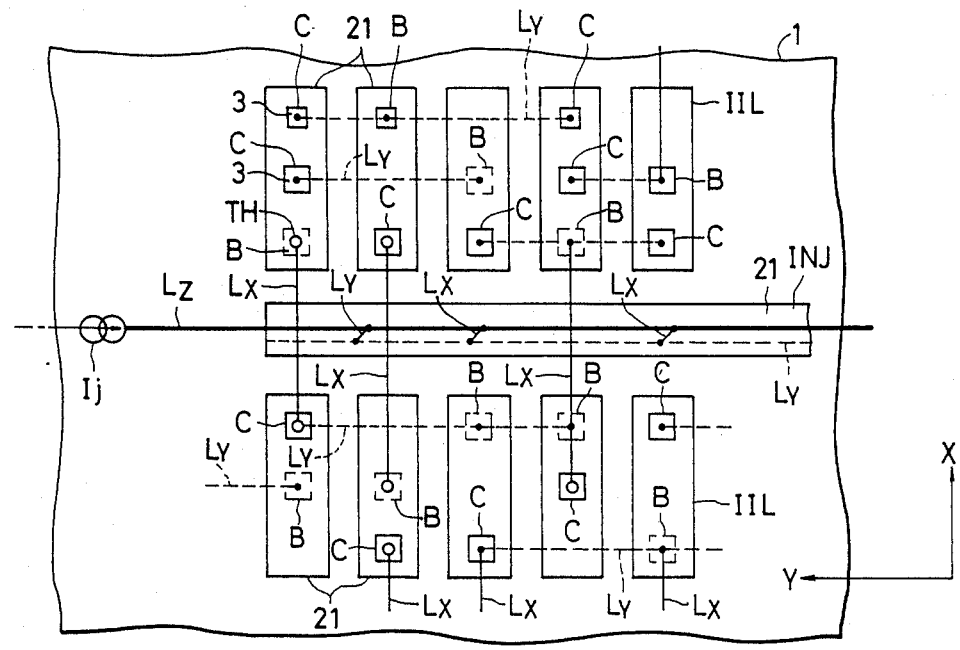
FIG. 3(c) is a schematic top plan view of a semiconductor device, to which the present invention is applied, and shows one example of application of a third-layer wiring of a multi-layered wiring structure.
Figure 3D:
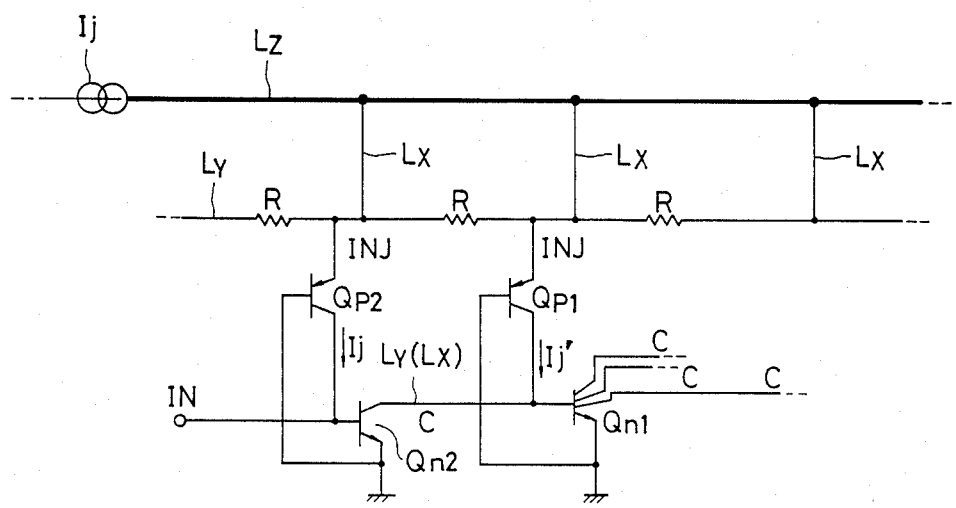
FIG. 3(d) shows an equivalent circuit diagram of FIG. 3(c)

FIG. 3(c) is a top plan view, and FIG. 3(d) is an equivalent circuit diagram of the same. As shown, the third wirings $L_Z$ are so drawn as are thicker than the first and second wirings $L_Y$ and $L_X$. It should be noted in FIG. 3(c) that the wirings $L_Z$ are wired in the same direction as the wirings $L_Y$ formed on the injector INJ and are electrically connected at several portions by the wirings $L_X$. As a result, as shown in the equivalent circuit diagram of FIG. 3(d), the voltage drop of the injector INJ due to the unnegligible parasitic resistances R, R and so on of the wirings $L_X$ is reduced to uniform the voltage between the two terminals of the injector INJ elongated on the substrate and equalizes injector currents $I_j$ and $I_j'$ to uniform the speed of the IIL gates.

Figure 3E:
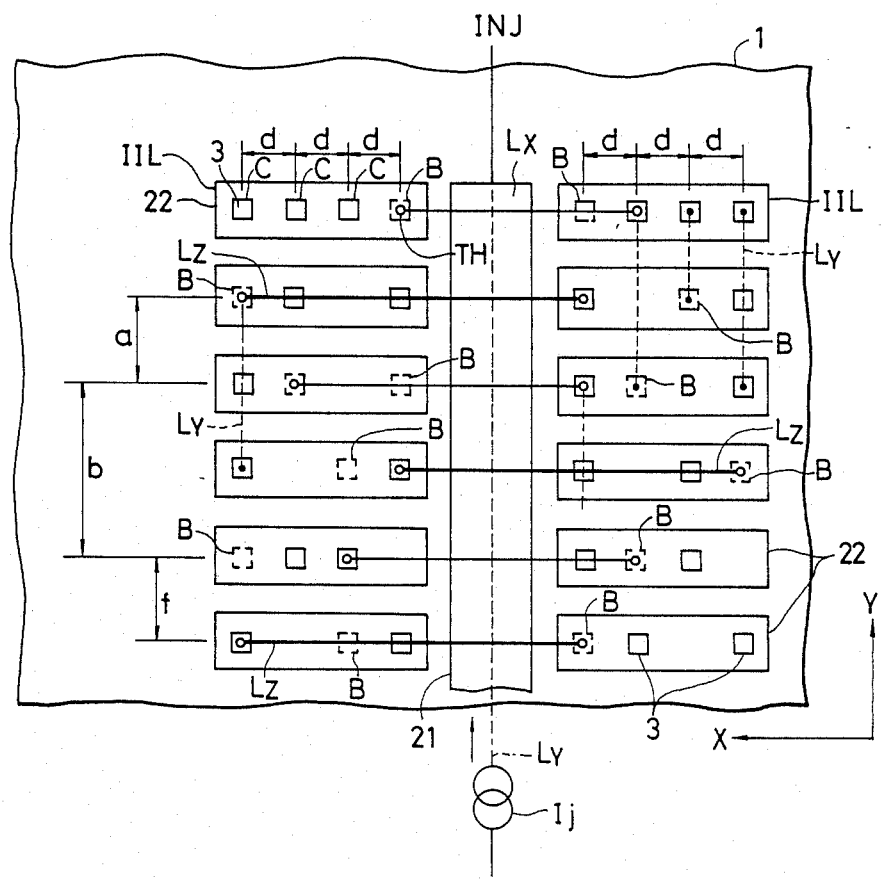
FIG. 3(e) is a schematic top plan view of a semiconductor device, to which the present invention is applied, and shows another example of the third-layer wiring.

FIG. 3(e) shows the method of wiring the wirings $L_Z$ in a finer IIL element. In case the gate array pitch a is made smaller than the minimum array pitch b of the second wires $L_X$ so as to ensure that fineness, an IIL gate incapable of being wired by the wirings $L_X$ is formed across the injector INJ. These IIL gates are wired by the wirings $L_Z$. As a result, the gate array pitch a can be made equal to the array pitch f between the wirings $L_X$ and $L_Z$ to facilitate the automatic wiring by the CAD.

Figure 4:
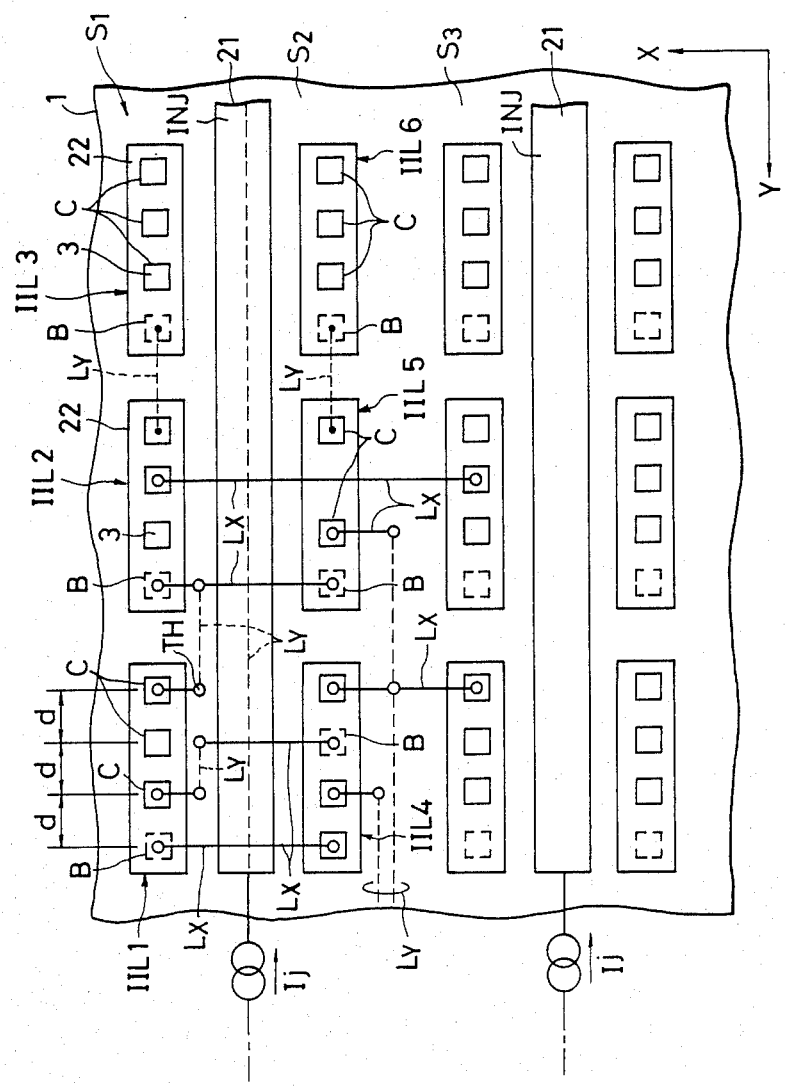
FIG. 4 is a schematic top plan view showing a semiconductor device, in which the present invention is applied to an IIL element layout different from that of FIG. 1.

FIG. 4 shows the case in which the present invention is applied to another array example of the IIL gates. In FIG. 4, there is shown a high-speed IIL circuit in which the gate electrode (i.e., the base B or collector C) of each IIL gate is arrayed in parallel with the injector INJ. In a semiconductor integrated circuit device formed with the IIL gates (IIL1 to IIL6) having such a layout, the first wirings $L_Y$ are formed in the first layer of the multi-layered wiring structure, and the second wirings $L_X$ are formed in the second layer of the same. The first wirings $L_Y$ are formed in the same direction as the gate electrode array direction (Y) in the IIL gate. On the other hand, the second wirings $L_X$ are formed in the direction perpendicular to the gate electrode array direction (Y).

Moreover, the extending direction of the first wirings $L_Y$ is identical to that of the injection diffusion layers 21, whereas the extending direction (X) of the second wirings $L_X$ is perpendicular to that of the injector diffusion layers 21. Most of the second wirings $L_X$ are used to connect the IIL gates IIL1 to IIL3 formed in the area $S_1$ formed on one side of each injector diffusion layer 21 and the IIL gates IIL 4 to IIL6 formed in the area $S_2$ on the other side. On the other hand, most of the first wirings $L_Y$ are used to connect the IIL gates in the area $S_1$ (or $S_2$).

Figure 5A:
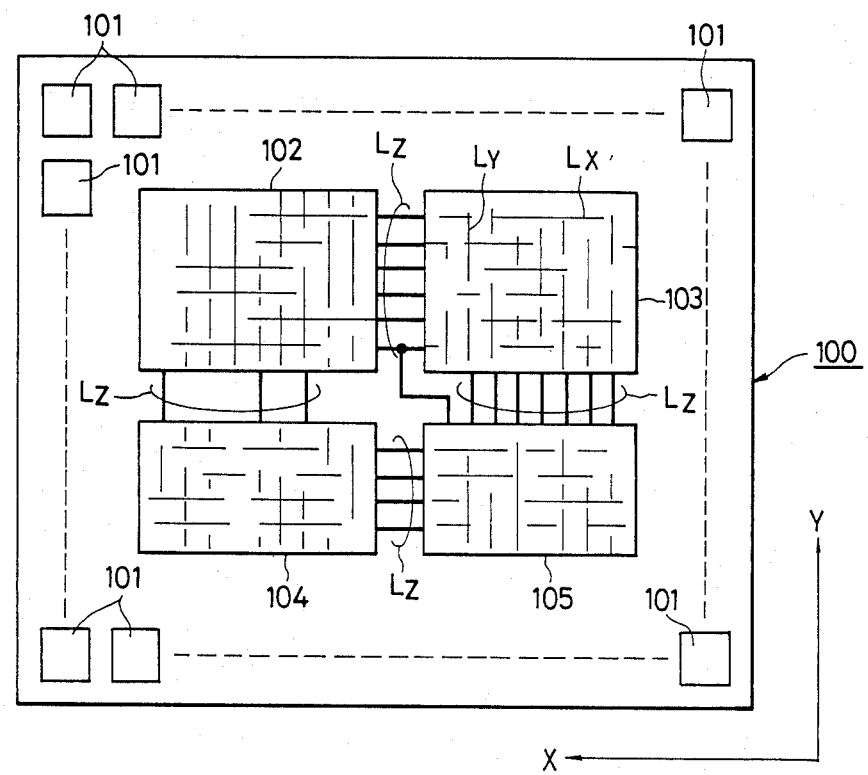
FIG. 5(a) is a top plan layout showing the whole structure of a semiconductor device, to which the present invention is applied, and shows a wiring state of circuit blocks 102 to 105.

FIG. 5(a) shows the overall construction of the semiconductor integrated circuit device thus far described.

In a semiconductor integrated circuit device 100 shown in FIG. 5(a), a plurality of IILs are formed in each of blocks 102, 103, 104 and 105 by both the first wirings $L_Y$ formed in the first layer of the multilayer wiring structure and the second wirings $L_X$ formed in the second layer of the same to wire the IIL gates of those blocks. Moreover, the blocks are also wired by the third wirings $L_Z$ as first and second and third conductive strips which are formed in the third layer of the multilayer wiring structure. Therefore, the first wirings formed over a first insulative material covering the substrate, and the second wirings formed over a second insulating material covering at least the first wirings, and the third wirings disposed over a third insulative material. As a result, the plural IIL elements or linear elements (or analog circuit elements) constitute one circuit function block, and a plurality of these circuit function blocks are connected to constitute the semiconductor integrated circuit device 100 having an arbitrary function. In this case, moreover, the wirings in and between the blocks are formed in the different wiring layers so that they can be designed independently of each other without any interference. As a result, by changing only the wirings between the blocks while leaving the functions in the blocks as they are, for example, it is possible to freely construct a variety of semiconductor integrated circuit devices having high functions. Reference numeral 101 appearing in FIG. 5(a) designates bonding pads.

Figure 5B:
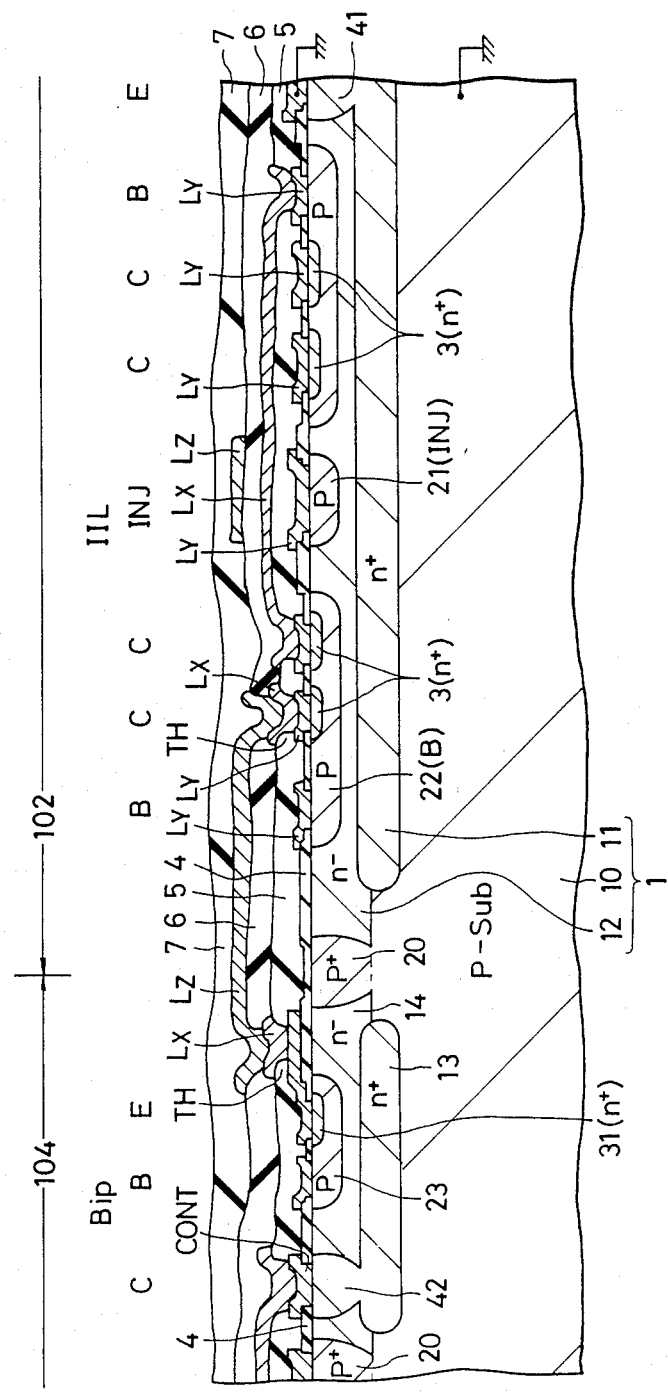
FIG. 5(b) is a sectional view of FIG. 5(a)

FIG. 5(b) is a sectional view of a portion of the semiconductor integrated circuit device 100, to which the present invention is applied and shows portions of the circuit block 102 composed of a plurality of IIL elements and the circuit block 104 having a bipolar transistor BIP as a linear element (or analog circuit element).

As has been described above, the IIL element portion is constructed of: a substrate 1 having a p-type semiconductor substrate 10, an $n^-$-type epitaxial layer 12 formed on the substrate 10, and a buried layer 11 formed selectively between the semiconductor substrate 10 and the $n^-$-type layer 12; an injector diffusion layer 21 and a base layer 22 formed selectively in the principal face of that substrate 1; and collector layers 3, 3 and so on formed in the principal face of the base layer 22. On the other hand, the bipolar transistor Bip is constructed of: a collector buried layer 13 formed simultaneously with the buried layer 11 of the IIL portion; an $n^-$-type epitaxial layer 14 formed simultaneously with the $n^-$-type epitaxial layer 12 of the IIL portion; a base layer 23 formed simultaneously with the injector layer 21 and the base layer 22 of the IIL portion; and an emitter layer 31 formed simultaneously with the collector layer 3 of the IIL portion. Likewise and simultaneously formed are an emitter electrode leading layer 41 of the IIL portion and a collector electrode leading layer 42 of the bipolar transistor. In the fabricating process, are selectively formed on the p-type semiconductor substrate 10 the buried layers 11 and 13, on which is formed the epitaxial layer 12 (or 14). Then, an inter-element separating layer 20 is formed, and the individual electrode leading layers 41 and 42 are formed. After this, the injector layer 21 and the base layer 22 of the IIL portion and the base layer 23 of the bipolar transistor Bip are formed, and the surface oxide film is selectively etched to form the contact holes CONT. After this, the electrodes or wirings of each element are formed by the first wirings $L_Y$. After this, the first inter-layer insulating film 5 made of a polyimide resin or the like is formed. After the through holes TH are formed in the portion of the insulating film 5, the second wiring $L_Y$ are formed to be connected with the first wirings $L_Y$ Next, a second inter-layer insulating film 6 made of a polyimide resin or the like is prepared and is again formed selectively with the through holes. Then, the third wirings $L_Z$ are formed and covered with a passivation film 7 made of a polyimide resin or the like. Incidentally, this passivation film 7 on the bonding pad 101, as shown in FIG. 5(a), is removed, and the resultantly exposed portions of the bonding pad 101 are connected with Au wires. As described above, the bipolar transistor and the IIL can be formed by the common fabrication process so that an IC can be produced at a reasonable cost without any increase in the process cost.

The results of the present invention will be described in the following.

The IIL gates are connected by the first wirings arranged in a common direction, the second wirings arranged in the direction perpendicular to the first wires, and the through holes connecting the first and second wirings, so that the wires connecting the IIL gates can be regulated suitably for automation. This results in an effect to automate the wiring design and sufficiently optimize the advantages of the IIL elements.

Although the present invention has been specifically described on the basis of the embodiment, it should not be limited to the embodiment but can be variously modified without departing from the gist thereof. For example, the electrodes of the aforementioned injectors need not be led out all over the surface but can be led out partially from suitable portions. Moreover, plural columns of injectors having different running directions may be arranged in parallel.

Although the present invention has been described hereinbefore in case it is applied to the analog/digital composite type semiconductor integrated circuit device, it should not be limited thereto but can be applied to an especially digital semiconductor integrated circuit device of a bipolar/MOS composite type semiconductor integrated circuit device, for example.

What is claimed is:

1. A semiconductor device comprising:
   (1) an elongated injector region formed in a semiconductor substrate, which has an upper surface and is extended in one direction, said elongated injector region being interposed between first and second surface area of said substrate along said one direction thereof;
   (2) a plurality of first spaced base regions with collectors therein constituting first IIL gates formed at said first surface area along said one direction of said injector region and closely spaced therefrom;
   (3) a plurality of second spaced base regions with collectors therein constituting second IIL gates formed at said second surface area along said one direction of said injector region and closely spaced therefrom;
   (4) first generally parallel conductive layers extending over said substrate and being connected to electrodes of selected ones of said first or second IIL gates; and
   (5) second generally parallel conductive layers extending in a different direction to said first conductive layers over said substrate and being connected to electrodes of predetermined ones of said first or second IIL gates,
   wherein said elongated injector is a doped region which is formed by selectively implanting an impurity into said substrate, and wherein at least one of said first conductive layers is formed along and in electrical contact with the whole upper surface of said doped region.

2. A semiconductor device according to claim 1, wherein a direction of said first conductive layer is substantially parallel to said one direction of said injector region.

3. A semiconductor device according to claim 1, wherein said first and second conductive layers are substantially perpendicular to each other.

4. A semiconductor device according to claim 1, wherein said first and second wirings are separate from each other and said substrate by an insulative material, and wherein said second conductive layers connect said electrodes of selected first IIL gates with said electrodes of predetermined second IIL gates at the through holes which are formed said insulative material.

5. A semiconductor device according to claim 1, wherein the pitch of said first conductive layers is substantially equal to the pitch of the electrodes of one of said first or second IIL gates.

6. A semiconductor device according to claim 5, wherein the pitch of said second conductive layers is substantially equal to the pitch of said electrodes of first or second IIL gates.

7. A semiconductor device according to claim 4, wherein said through holes are formed on the electrodes of said first or second IIL gates formed by means of said first conductive layers.

8. A semiconductor device according to claim 7, wherein the area of the electrodes of said first or second IIL gates exposed through said through holes are substantially equal to or slightly smaller than the area of said electrodes viewed from above.

9. A semiconductor device according to claim 7, wherein the width of each of said first and second conductive layers in the portion of said through hole is substantially equal to the width of each of said first and second conductive layers in portions other than said portion of said through hole.

10. A semiconductor device comprising:
   (1) a plurality of circuit blocks having circuit elements formed in a semiconductor substrate;
   (2) first generally parallel conductive strips formed over a first insulative material covering said substrate and being connected to selected ones of said circuit elements in each of said circuit blocks;
   (3) second generally parallel conductive strips formed over a second insulative material covering at least said first conductive strips and being connected to predetermined ones of said circuit elements in each of said circuit blocks, said second conductive strips being arranged substantially perpendicular to said first conductive strip; and
   (4) third conductive strips disposed over a third insulative material covering at least said second conductive strips and providing electrical connections between (or among) selected ones of said circuit blocks, wherein at least predetermined one of said circuit blocks have first and second IIL gates,
   wherein the pitch of the first conductive strips is substantially equal to the pitch of the electrodes of one of the first or second IIL gates and the pitch of the second conductive strips is substantially equal to the array pitch of the first or second IIL gates.

11. A semiconductor device according to claim 10, wherein said selected ones of said circuit blocks includes IIL elements, said IIL elements comprise an elongated injector and gates.

12. A semiconductor device according to claim 10, wherein said selected ones of said circuit blocks include one block having IIL elements and another block having bipolar elements.

13. A semiconductor device according to claim 10, wherein said third strips are power wirings for supplying operating voltage to said IIL elements.

14. A semiconductor device according to claim 11, wherein said third strips are formed over said second insulative material in the extending direction of said first strips formed in contact with said injector.

15. A semiconductor device according to claim 11, wherein said third strips are formed to be generally parallel with said second strips to electrically connect the electrodes of said gates formed in the areas at opposite ends of said injector.

16. A semiconductor device comprising:
   (1) an elongated semiconductor region formed in a semiconductor substrate;
   (2) a plurality of spaced semiconductor regions facing to but spaced from one elongated side of said elongated semiconductor region;
   (3) each of said semiconductor regions and said elongated region performing a circuit component function;
   (4) first elongated conductive members extending over said substrate and being generally parallel to said elongated region; and
   (5) second elongated conductive members extending over said substrate with a predetermined angle to said first elongated conductive members,
   wherein selected ones of said first elongated conductive members are connected to predetermined ones of said spaced semiconductor regions and selected ones of said second elongated conductive members are connected to predetermined ones of said first elongated conductive members, and
   wherein said elongated semiconductor region is a doped region which is formed by selectively implanting an impurity into the substrate, and wherein one of the first conductive members is formed along and in electrical contact with a whole upper surface of the doped region.

17. A semiconductor device according to claim 16, wherein said first and second conductive members are formed at different level.

18. A semiconductor device according to claim 16, wherein said first and second conductive members are substantially perpendicular to each other.

19. A semiconductor device according to claim 23, wherein said semiconductor regions are formed at the another elongated side of said elongated regions and closely spaced therefrom.

20. A semiconductor device according to claim 19, wherein said second conductive members extend transversely to said elongated region.

21. A semiconductor device according to claim 18, wherein said circuit component function is IIL function.

22. A semiconductor device comprising:
   (1) an elongated injector region formed in a semiconductor substrate, which has an upper surface and is extended in one direction, said injector region being interposed between first and second surface areas of said substrate along said one direction thereof;
   (2) a plurality of first spaced base regions with collectors therein constituting first IIL gates formed at said first surface area along said one direction of said injector region and closely spaced therefrom;
   (3) a plurality of second spaced base regions with collectors therein constituting second IIL gates formed at said second surface area along said one direction of said injector region and closely spaced therefrom;
   (4) first generally parallel conductive layers extending over said substrate and being connected to electrodes of selected ones of said first or second IIL gates; and
   (5) second generally parallel conductive layers extending perpendicular to said first conductive layers over said substrate and being connected to electrodes of predetermined ones of said first of second IIL gates, wherein said plurality of first and second spaced base regions are arranged at first predetermined widths (W1) from each other, wherein collectors in said first and second spaced base regions are arranged at second predetermined widths (W2) from each other, and wherein said first generally parallel conductive layers are arranged at said second predetermined widths (W2) and said second generally parallel conductive layers are arranged at a half pitch of said first predetermined widths (W1)×n (1, 2, 3, ...).

23. A semiconductor device according to claim 22, wherein said elongated injector is a doped region which is formed by selectively implanting an impurity into said substrate, and wherein at least one of said first conductive layers is formed along and in electrical contact with a whole upper surface of said doped region.

24. A semiconductor device according to claim 22, wherein said first and second generally parallel conductive layers are formed at different levels.

25. A semiconductor device according to claim 24, wherein said first and second generally parallel conductive layers are separated from each other and said substrate by an insulative material without portions connected to said electrodes.

* * * * *